(12) United States Patent
Schulman

(10) Patent No.: US 6,376,858 B1
(45) Date of Patent: *Apr. 23, 2002

(54) RESONANT TUNNELING DIODE WITH ADJUSTED EFFECTIVE MASSES

(75) Inventor: Joel N. Schulman, Malibu, CA (US)

(73) Assignee: Hughes Electronics Corp., El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,541

(22) Filed: Nov. 20, 1998

(51) Int. Cl.$^7$ ............... H01L 29/205; H01L 29/88
(52) U.S. Cl. .................................. 257/25; 257/22
(58) Field of Search ................................ 257/25, 22

(56) References Cited

U.S. PATENT DOCUMENTS 5,432,361 A * 7/1995 Taguchi ...................... 257/184
5,952,673 A * 9/1999 Higashi ........................ 257/22

OTHER PUBLICATIONS

Arai et al "Experimental . . . : Tunneling Diode" *IEEE Elec. Dev. Lett.* vol. 17 No. 10 10/96 pp 491–493.*
Koch et al "In Ga As . . . : Tunnel Barriers" *IEEE Trans. Elec. Dev.* vol. 41 No. 9 9/94 pp 1498–1503.*
Broekaert et al "Extremely . . . Diodes" *IEDW* 21.5.1 pp 559–562, 1989.*

* cited by examiner

*Primary Examiner*—Jerome Jackson, Jr.
(74) *Attorney, Agent, or Firm*—Terje Gudmestad

(57) ABSTRACT

A tunnel diode has a quantum well having at least one layer of semiconductor material. The tunnel diode also has a pair of injection layers on either side of the quantum well. The injection layers comprise a collector layer and an emitter layer. A barrier layer is positioned between each of the injection layers and the quantum well. The quantum well has an epitaxial relationship with the emitter layer. An amount of one element of the well layer is increased to increase the lattice constant a predetermined amount. The lattice constant may have a reduction in the conduction band energy. A second element is added to the well layer to increase the conduction band energy but not to change the lattice constant. By controlling the composition in this matter, the negative resistance, and thus the effective mass, may be controlled for various diode constructions.

4 Claims, 1 Drawing Sheet

RESONANT TUNNELING DIODE WITH ADJUSTED EFFECTIVE MASSES

TECHNICAL FIELD

The present invention relates generally to semiconductor diodes. More specifically, the present invention relates to a double barrier tunnel diode.

BACKGROUND ART

A diode is a semiconductor device having a non-linear voltage-current relationship. Diodes are important solid-state devices and are used in many electronic applications. The tunnel diode is one of a variety of diodes having the characteristic of negative resistance. As the term is used, negative resistance is a voltage-current behavior wherein, over certain voltage ranges, increasing the voltage applied across the diode leads to decreased current carried through the diode. By contrast, in most devices, an increasing applied voltage results in increasing current. Tunnel diodes have a number of applications, including high frequency oscillator circuits and high frequency electronic circuits.

One type of tunnel diode is the double barrier tunnel diode. One known double barrier tunnel diode includes a gallium arsenide quantum well with a thin barrier layer of aluminum gallium arsenide epitaxially joined to each side of the quantum well. This structure, termed a quantum barrier, in turn lies between two injection layers of gallium arsenide. The quantum barrier creates an energy barrier to the flow of electrons that can be overcome by electrons only under certain conditions, and which results in the negative resistance characteristic of interest over a range of applied bias voltage. Electrons are injected into the quantum barrier from the conduction band of one of the injection layers under an internal voltage produced by the applied external voltage. The internal voltage increases the energy of the injected electrons to satisfy the resonant tunneling condition of the quantum barrier. Under the proper conditions of voltage sufficient to satisfy the resonant condition, the incoming electron has the same energy as the resonance level in the quantum well. These electrons tunnel through the quantum barrier. As the bias voltage is increased further, the energy levels no longer align and the current decreases, resulting in the negative resistance effect.

Another known double barrier tunnel diode is disclosed in U.S. Pat. No. 5,296,721. In this diode, the valley current is decreased in a resonant tunneling diode by introducing strain into the well region. The barrier layers have a biaxially strained epitaxial relationship with the material of the quantum well. The biaxial strain is sufficient to reduce the energy of the heavy holes in the quantum well to less than the energy of the conduction band minimum energy of the electron injection layer.

One problem with prior known devices is that they are not easily tailored for specific high-speed circuit applications, such as high-speed signal processing. These devices include comparators, digital to analog converters, sample and hold circuits, logic, and frequency multipliers. In many circuit applications, the negative resistance portion of the current voltage curve is not optimized. Thus, power consumption and heat production, as well as noise sensitivity, is increased.

SUMMARY OF THE INVENTION

It is, therefore, one object of the invention to provide a resonant tunneling diode construction that is capable of being easily modified and manufactured to reduce power consumption and heat generation in circuits and decrease sensitivity to noise. It is a further object of the invention to provide a resonant tunneling diode capable of less power consumption, particularly at microwave frequencies of tens of gigahertz in bandwidth.

In one aspect of the invention, a double barrier tunnel diode has a quantum well with at least one layer of semiconductor material. The tunnel diode also has a pair of injection layers on either side of the quantum well. The injection layers comprise a collector layer and an emitter layer. A barrier layer is positioned between each of the injection layers and the quantum well. The quantum well has an epitaxial relationship with the emitter layer. The amount of one element of the well layer is increased to increase the lattice constant a predetermined amount. This may cause a reduction in the resonant energy level. A second element is added to the well layer to increase the resonant energy level, but not to change the lattice constant. By controlling the composition in this matter, the effective mass, and thus the negative resistance, may be controlled for various diode constructions while retaining some freedom to adjust the resonant energy level in the quantum well.

One advantage of the invention is that by varying the effective mass in the well, the width of the voltage range of the negative resistance region of the resonant tunneling diode may easily be controlled during manufacture.

In the preferred structure, the well composition is modified from a commonly known structure, which uses just InGaAs. In the present invention, InGaAlAs is used in the well. By substituting aluminum for gallium in the well, only a small effect on the lattice constant is achieved. However, the resonant energy of the conduction band increases. In the present invention, the conduction band level and the lattice constant may be adjusted independently.

Other features and advantages of the present invention will be apparent from the following detailed description of the preferred embodiment, taken in conjunction with the accompanying drawings, which illustrate, by way of example, the principles of the invention.

BEST MODE(S) FOR CARRYING OUT THE INVENTION

Figure 1:
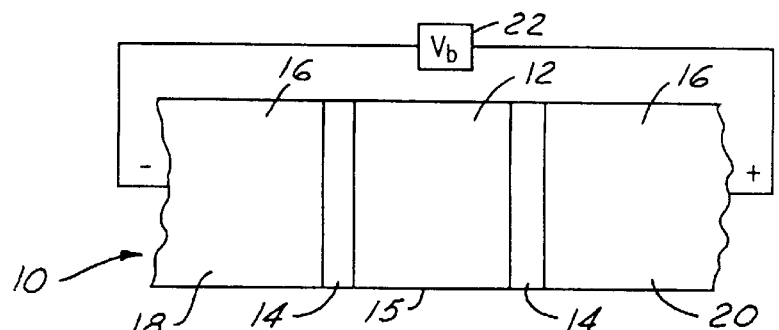
FIG. 1 is a schematic sectional view of a double barrier tunnel diode.

Referring now to FIG. 1, a resonant tunneling diode 10 is illustrated. Diode 10 has a quantum well 12 bounded on each side by a barrier layer 14. Quantum well 12 and the two barrier layers 14 are together termed a quantum barrier 15. Disposed outwardly of the barrier layers 14, on either side of the quantum barrier 15, are a pair of injection layers 16. Diode 10 is prepared by depositing these layers sequentially.

Injection layers 16 have an emitter 18 and a collector 20. Emitter 18 is where incoming electrons enter diode 10. Collector 20 is where the electrons leave diode 10.

In one construction of the device, the substrate is an indium phosphide (InP) substrate. Emitter layer 18 and collector layer 20 are preferably formed from indium gallium arsenide (InGaAs). Barrier layers 14 are preferably formed from aluminum arsenide (AlAs). Well 12 is preferably formed of indium gallium aluminum arsenide (InGaAlAs). The well material is a modification of the conventional structures that typically use just indium gallium arsenide (InGaAs). Preferably, each of these materials is in single crystal form.

Barrier layers 14 are in epitaxial relation to the quantum well 12. Injection layers 16 are in epitaxial relation to barrier layers 14. An "epitaxial" relation is one wherein the adjacent layers or structures have the same crystal structure and are crystallographically continuous between the two layers or structures. Even though the crystal structures are the same and continuous between the layers, however, does not mean that the lattice parameters of the two layers or structures are identical. In most cases, the lattice parameters are slightly mismatched, leading to a biaxial strain condition.

Biaxial strain is present when there is a strain in two orthogonal directions in a material. Such biaxial strain often arises in other context when two materials with different lattice constants or coefficients of expansion are joined at an interface, so that stresses and strains are produced in each material in orthogonal directions parallel to the interface.

In operation, electrons are supplied from a voltage source 22 through emitter layer 18. Electrons from emitter layer 18 will resonantly tunnel through the quantum barrier 15 to the other injection layer 16, i.e. the collector layer 20. The result is a current through the quantum barrier 15 and the diode 10.

Figure 2:
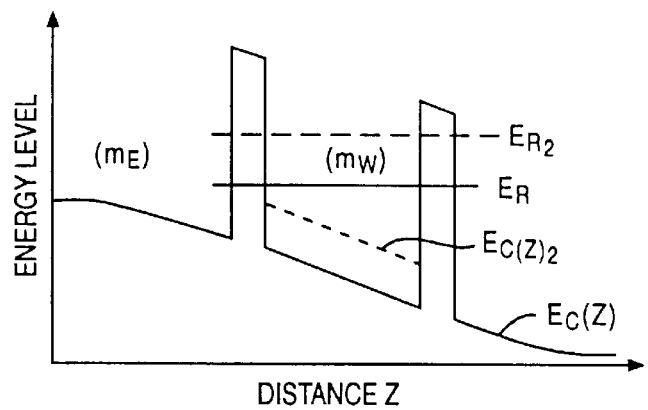
FIG. 2 is a plot of the energy states in the diode of FIG. 1.

Referring now to FIG. 2, the relevant electron energy states for diode 10 of FIG. 1 are shown. The line $E_C$ (Z) represents the lowest electron energy states for the conduction band of each layer. Conduction through diode 10 occurs when the conduction band electrons injected from emitter layer 18 that are under the influence of the bias voltage tunnel through barrier layer 14. The electrons are then conducted through quantum well 12. The electrons tunnel through the other barrier layer 14 and enter collector layer 20.

$E_R$ is the resonant energy in well 12. As described above, by substituting some aluminum for gallium in the well, the lattice constant is insignificantly affected. However, adding aluminum increases the energy of the conduction band significantly. Also, by increasing the indium to gallium ratio in well 12, the conduction band may also be decreased. This also causes the lattice constant to be increased.

By varying the semiconductor composition and inducing strain, the effective masses in the material of the semiconductor layers may be modified, while retaining some degree of adjustability of the resonance energy. The effective mass has a significant influence on the negative resistance characteristic of the diode 10. The effective mass especially influences the width in voltage of the negative resistance part of the current-voltage curve. By modifying the composition of the layers of emitter 18 and well 12, the effective mass may be modified in a controlled fashion by varying alloy composition and strain. Of course, the "optimal" current/voltage curve depends on the particular circuit. By having the capability of tailoring the effective mass in the emitter 18 and well 12, the current to voltage curve can be optimized. Thus, the dependence of the effective mass depends on both the composition and the strain.

As shown, the resonant energy may be increased to an amount $E_{R2}$ increasing the conduction band energy $E_{C(Z)2}$ a corresponding amount.

Figure 3:
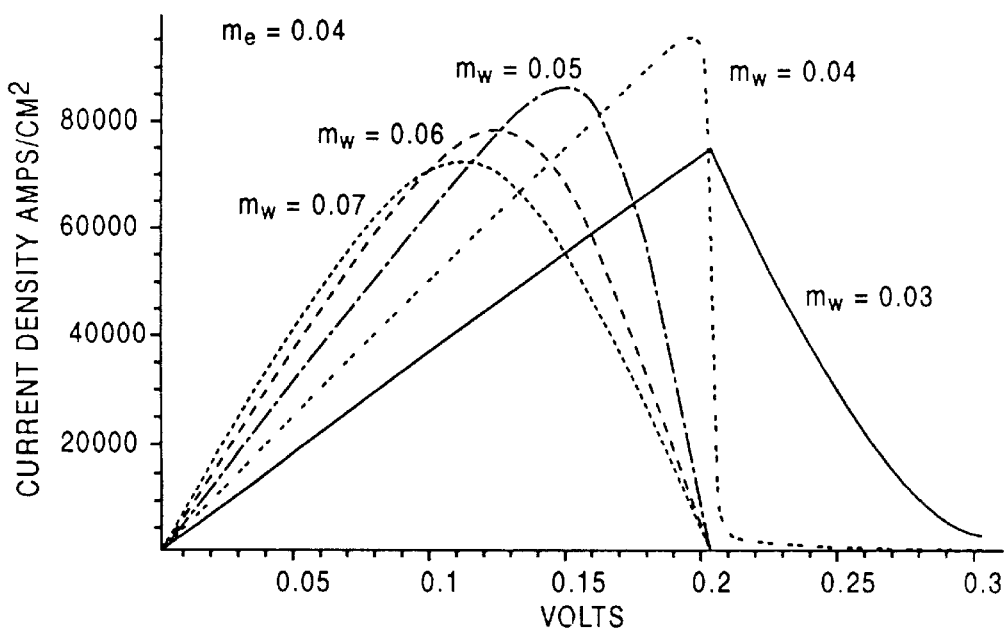
FIG. 3 is a negative resistance plot of current versus voltage in which the effective mass in the well is varied while the emitter effective mass is kept constant.

Referring now to FIG. 3, a plot of current density in amps/centimeters$^2$ versus voltage is plotted. This plot is also referred to as a negative resistance plot since the slope of the plot is related to the resistance of the device. The current increases for larger voltages, but this is not shown. For this example, the effective mass of the emitter $m_e$ is kept constant at 0.04. The effective mass of the well 12, $m_w$, is varied from 0.03 to 0.07. The slope of the curve is related to the negative resistance. The width in voltage varies from abrupt millivolts for a well mass of 0.04, to about 100 millivolts for $m_w$=0.07 and 0.03. The main determining factor on negative resistant voltage width is the effective mass ratio between the emitter and the well. Thus, by choosing the appropriate ratio of the effective mass between the emitter and the well, an appropriate characteristic curve for the circuit application may be chosen.

To construct the tunneling diode according to the present invention, a quantum well layer is formed on the substrate. The quantum well layer has an effective mass and a lattice constant. A pair of barrier layers is formed adjacent to the quantum well layer. The barrier layers are in epitaxial relation to the quantum well layer. In this example, the quantum well layer is formed of InGaAlAs and the barrier layers are formed of AlAs. In the quantum well layer, Al is substituted for some of the Ga in the InGaAs that is commonly used. This has little influence on the lattice constant, but increases the energy of the conduction band significantly.

A pair of injection layers is formed adjacent to the barrier layers. One of the injection layers is an emitter layer, and the other is a collector layer. Also by increasing the indium to gallium ratio in the well, the conduction band may be decreased and the lattice constant increased.

There also are similar semiconductor material combinations that have similar behavior. Further, one skilled in the art would recognize that by changing the composition of the emitter rather than the well would also change the characteristic ratios of the device.

While particular embodiments of the invention have been shown and described, numerous variations and alternate embodiments will occur to those skilled in the art. Accordingly, it is intended that the invention be limited only in terms of the appended claims.

What is claimed is:

1. A resonant tunneling diode comprising:
   a quantum well layer composed of indium, gallium, arsenic and an alloy element other than indium, arsenic or gallium, said quantum well having a quantum well effective mass;
   a pair of injection layers composed of indium gallium arsenide on either side of the quantum well, one of the injection layers being a collector layer, the other of the injection layers being an emitter layer; and
   a barrier layer composed of aluminum arsenide positioned between each of said electron injection layers and said quantum well;
   said quantum well having an epitaxial relationship with said pair of injection layers and the barrier layers.

2. A resonant tunneling diode as recited in claim 1 wherein said effective mass is between about 0.03 and about 0.07.

3. A resonant tunneling diode as recited in claim 1 wherein said alloy element comprises aluminum.

4. A resonant tunneling diode as recited in claim 1 wherein said quantum well is composed of indium gallium aluminum arsenide.

* * * * *